US011990868B2

(12) United States Patent
Pham et al.

(10) Patent No.: US 11,990,868 B2
(45) Date of Patent: May 21, 2024

(54) SPIN HALL OSCILLATOR

(71) Applicant: TOKYO INSTITUTE OF TECHNOLOGY, Tokyo (JP)

(72) Inventors: Nam Hai Pham, Tokyo (JP); Takanori Shirokura, Tokyo (JP)

(73) Assignee: TOKYO INSTITUTE OF TECHNOLOGY, Tokyo (JP)

( * ) Notice: Subject to any disclaimer, the term of this patent is extended or adjusted under 35 U.S.C. 154(b) by 297 days.

(21) Appl. No.: 17/435,577

(22) PCT Filed: Feb. 21, 2020

(86) PCT No.: PCT/JP2020/007010
§ 371 (c)(1),
(2) Date: Sep. 1, 2021

(87) PCT Pub. No.: WO2020/179493
PCT Pub. Date: Sep. 10, 2020

(65) Prior Publication Data
US 2022/0060149 A1  Feb. 24, 2022

(30) Foreign Application Priority Data
Mar. 1, 2019  (JP) .................. 2019-037682

(51) Int. Cl.
*H03B 15/00* (2006.01)
*G01R 33/09* (2006.01)
*G11B 5/39* (2006.01)
*H10N 50/10* (2023.01)
(Continued)

(52) U.S. Cl.
CPC ......... *H03B 15/006* (2013.01); *G01R 33/093* (2013.01); *G11B 5/3909* (2013.01); *H10N 50/10* (2023.02); *H10N 50/85* (2023.02); *H10N 52/80* (2023.02)

(58) Field of Classification Search
CPC .. H03B 15/006; H03B 15/003; G01R 33/093; G01R 33/098; G11B 5/3909; H10N 50/10; H10N 50/85; H10N 52/80; H01L 29/82
See application file for complete search history.

(56) References Cited

U.S. PATENT DOCUMENTS 9,076,537 B2 * 7/2015 Khvalkovskiy ........ H10N 50/10
9,460,397 B2 * 10/2016 Apalkov ............. G11C 11/1675
2015/0145576 A1 * 5/2015 Wu ......................... G11C 11/18
327/187

FOREIGN PATENT DOCUMENTS

JP  2010245419 A  10/2010
JP  2015100105 A  5/2015
JP  2017520107 A  7/2017
(Continued)

OTHER PUBLICATIONS

International Search Report for International Application No. PCT/JP2020/007010; dated Apr. 21, 2020.
(Continued)

*Primary Examiner* — Jeffrey M Shin
(74) *Attorney, Agent, or Firm* — CANTOR COLBURN LLP

(57) ABSTRACT

An oscillator includes a spin current source, and a free layer coupled to the spin current source. The free layer has a magnetization hard axis that is parallel to a quantization axis of a spin current injected by the spin Hall effect of the spin current source.

31 Claims, 19 Drawing Sheets

(51) Int. Cl.
    *H10N 50/85*    (2023.01)
    *H10N 52/80*    (2023.01)

(56) References Cited

FOREIGN PATENT DOCUMENTS

| JP | 2017204833 A | 11/2017 |
| WO | 2014025838 A1 | 2/2014 |
| WO | 2015195122 A1 | 12/2015 |

OTHER PUBLICATIONS

PCT International Preliminary Report on Patentability for International Application No. PCT/JP2020/007010; Date of Completion, Sep. 23, 2020.

Pham et al., "Conductive BiSb topological insulator with colossal spin Hall effect for ultra-low power spin-orbit-torque switching", Proceedings of Spie, Sep. 20, 2018, vol. 10732, pp. 107320U-1-107320U-7.

Torrejon et al., "Neuromorphic computing with nanoscale spintronic oscillators", Nature, vol. 547, Jul. 27, 2017; pp. 428-432.

Zeng et al., "Ultralow-current-density and bias-field-free spin-transfer nano-oscillator", Scientific Reports, 3:1426; 5 pages.

\* cited by examiner

FIG.2B

| PARAMETER | VALUE | PARAMETER | VALUE |
|---|---|---|---|
| DAMPING CONSTANT $\alpha$ | 0.005 | THICKNESS OF FREE LAYER $t_{FM}$ (nm) | 20 |
| SATURATION MAGNETIZATION $M_s$ (emu/cc) | 1200 | WIDTH OF SPIN CURRENT SOURCE $W_{SS}$ (nm) | 15 |
| LENGTH OF FREE LAYER $L_{FM}$ (nm) | 20~35 | THICKNESS OF SPIN CURRENT SOURCE $t_{SS}$ (nm) | 2 |
| WIDTH OF FREE LAYER $W_{FM}$ (nm) | 15 | SPIN HALL ANGLE $\theta_{SH}$ | 0.4 |

SPIN HALL OSCILLATOR

CROSS REFERENCE TO RELATED APPLICATIONS

This is the U.S. national stage of application No. PCT/JP2020/007010, filed on Feb. 21, 2020. Priority under 35 U.S.C. § 119(a) and 35 U.S.C. § 365(b) is claimed from Japanese Application No. 2019-037682, filed Mar. 1, 2019, the disclosure of which is also incorporated herein by reference.

BACKGROUND

1. Technical Field

The present disclosure relates to a spin Hall oscillator.

2. Description of the Related Art

In recent years, microwave oscillators using spin torque have been attracting attention because they provide a high Q value, they can be easily integrated using CMOS technology, etc. Such a microwave oscillator using spin torque is referred to as a spin torque oscillator (STO), which makes use of magnetization precession that occurs when a spin current is injected into a magnetic body.

The methods for acquiring microwaves from magnetization precession are roughly classified into two methods. One is a method directly using the high-frequency leakage magnetic field generated by the magnetization precession. The other is a method in which the magnetization precession is acquired as an electrical signal using the tunnel magnetoresistive (TMR) effect, and the electrical signal thus acquired is converted into microwaves to be emitted. The first method is simple in principle, but has a disadvantage in that microwaves can only be irradiated in a short distance range. In contrast, the second method requires a magnetic tunnel junction (MTJ) structure to be formed. However, this method provides a microwave output per element that is stronger than that provided in the leakage magnetic field extraction method. Accordingly, the second method has been attracting a great amount of attention.

STOs can be classified into two kinds based on the spin current generation method. The first is a method using spin polarization. In this method, a charge current flows through a pinned layer of the MTJ so as to generate a spin current that flows parallel to the charge current. In this method, the spin current generating efficiency is determined by the spin polarization ratio of the pinned layer. In principle, the spin polarization ratio cannot exceed 1. Such an arrangement provides only low spin current generating efficiency. Accordingly, such an arrangement requires a larger current in order to provide oscillation. For example, as described in Non-patent document 1, a current of 110 µA is required to provide oscillation at 0.9 GHz. It should be noted that a free layer has a normalized structure with a length of 50 nm, a width of 50 nm, and a thickness of 2 nm. In a case in which spin polarization is used, such a large amount of current passes through the MTJ. This degrades the durability of the MTJ, leading to a problem of poor reliability of the oscillator.

The second is a method using the spin Hall effect. In the second method, a charge current flows through a spin current source formed of a material having a strong spin-orbit interaction, so as to generate a spin current that is orthogonal to the charge current. With such an arrangement, the spin current source is coupled to a magnetic layer in which magnetization precession is to be provided, and a charge current is applied to the spin current source parallel to the interface between the magnetic layer and the spin current source. With this, the spin current generating efficiency is determined by the spin Hall angle and the ratio between the length of the spin current source and the film thickness thereof. The two parameters can both exceed 1. Accordingly, such a method using the spin Hall effect allows the spin current to be generated with high efficiency. Furthermore, with such a method using the spin Hall effect, the spin current is generated in a direction that is orthogonal to that of the charge current. Accordingly, the charge current for generating the spin current does not flow through the MTJ. With this, such a method is anticipated to provide an oscillator with improved reliability.

LIST OF RELATED ART DOCUMENTS

1. Patent Documents

Patent document 1
PCT Patent Publication No. 2017-520107
Patent Document 2
International Publication WO 2015/195122A1
Patent Document 3
International Publication WO 2014/025838A1

2. Non-Patent Documents

Non-Patent Document 1
Scientific Reports 3, 1426 (2013)
Non-Patent Document 2
Jacob Torrej on et. al, "Neuromorphic computing with nanoscale spintronic oscillators", Nature, VOL 547, 27 Jul. 2017, pp. 428-432

An oscillator using the spin Hall effect (which will be referred to as a "spin Hall oscillator" or simply as an "oscillator" in the present specification) requires a current for the spin-current source generating a spin current and a MTJ current for converting the magnetization precession into an electrical signal. Accordingly, such an oscillator using the spin Hall effect has a basic structure including three terminals, i.e., an injection electrode for injecting the MTJ current and the current for the spin-current source, a MTJ-current extraction electrode, and an extraction electrode of the current for the spin-current source. Such a three-terminal device has been attracting attention because it is capable of independently and actively controlling the magnitudes of the MTJ current and the current for spin-current source. As described in Patent documents 1 and 2, a three-terminal device has been proposed configured to be provide oscillation using only a spin current without a magnetic field applied by an external component. However, with the three-terminal device, the two current paths are each required to incorporate a control circuit. Such an arrangement has a disadvantage of a complicated overall structure of the oscillator. Furthermore, from a viewpoint of maximizing the TMR effect, the pinned layer is preferably magnetized parallel to the precession orbital plane of the free layer. However, with such an arrangement described in Patent documents 1 and 2, the precession orbital plane of the free layer is not optimized. Rather, the pinned layer can be magnetized in a direction that is orthogonal to that of the precession orbital plane of the free layer. Accordingly, such an arrangement is not able to provide a maximized TMR effect, leading to degradation of oscillation efficiency.

Also, as described in Patent document 3, an arrangement with two terminals configured to be capable of oscillating has been proposed. However, such an arrangement described in Patent document 3 requires an external magnetic field to provide oscillation. In order to apply the external magnetic field, a method in which an additional magnetic layer is provided is employed. However, such an arrangement leads to a problem of a complicated structure or an increased cost. Furthermore, the external magnetic field acts as a noise source, leading to a problem of degradation of the Q value of the oscillation spectrum.

SUMMARY

The disclosure invention has been made in view of such a situation.

An embodiment of the present disclosure relates to a spin Hall oscillator. The spin Hall oscillator includes a magnetic layer coupled to a spin current source layer or a MTJ element coupled to the spin current source layer. In some cases, the magnetic layer coupled to the spin current source will also be referred to as a "free layer" hereafter as appropriate. With such a structure provided with the MTJ element, the current for the spin current source is short-circuited to an output electrode for the MTJ current via a resistor element arranged in parallel with the MTJ element. This allows the spin Hall oscillator to operate as a two-terminal device.

In order to optimize the magnetization precession orbital plane of the free layer, or in order to provide oscillation without a magnetic field, the magnetic anisotropy of the free layer may preferably be controlled. Specifically, the free layer may preferably be configured to have a magnetization hard axis that is parallel to the quantization axis of the spin current injected from the spin current source. That is to say, in a case in which the quantization axis of the spin current is in they direction, the magnetization hard axis is designed to be the y axis. In this case, with the effective magnetic anisotropy coefficients with respect to the x axis, the y axis, and the z axis as $N_x'$, $N_y'$, and $N_z'$, the following expression may preferably be satisfied.

$$N_y' > N_x', N_z'$$

Here, the effective magnetic anisotropy coefficient represents an amount configured as a demagnetizing field coefficient $N_i$ (i=x, y, z) incorporating two components, i.e., an effective magnetic field due to the uniaxial crystal magnetic anisotropy converted to a demagnetizing field, and an effective magnetic field due to the interfacial magnetic anisotropy converted to a demagnetizing field. With the uniaxial crystal magnetic anisotropy coefficient in the i direction as $K_{Ui}$, with the interfacial magnetic anisotropy coefficient in the i direction as $K_{Ii}$, with the film thickness of the free layer as $t_{FM}$, and with the magnetization saturation of the free layer as $M_S$, the effective magnetic anisotropy coefficient in the i direction is represented by the following Expression (1). Also, in a case of calculating the effective magnetic anisotropy coefficient giving consideration to the induced magnetic anisotropy generated by film formation in the magnetic field, annealing in the magnetic field, or oblique deposition, an additional term may be included in the Expression (1) as appropriate.

$$N_i' = N_i - \frac{K_{Ui}}{2\pi M_S^2} - \frac{K_{Ii}}{2\pi t_{FM} M_S^2} \quad (1)$$

An embodiment of the present disclosure relates to a two-terminal spin Hall oscillator. The two-terminal spin Hall oscillator is configured including a spin current source and a free layer coupled to the spin current source. The free layer has a magnetization hard axis that is parallel to a quantization axis of a spin current injected due to a spin Hall effect of the spin current source.

Another embodiment of the present disclosure also relates to a two-terminal spin Hall oscillator. The two-terminal spin Hall oscillator is configured including: a spin current source; a magnetic tunnel junction (MTJ) device including a free layer coupled to the spin current source, a tunnel barrier layer, and a pinned layer; and an electrode coupled to the MTJ device. The spin Hall oscillator has a structure in which the spin current source is short-circuited to the electrode via a resistor element coupled in parallel with the MTJ device. The free layer and the pinned layer of the MTJ device each have a magnetization hard axis parallel to a quantization axis of a spin current injected by a spin Hall effect of the spin current source.

Yet another embodiment of the present disclosure also relates to a two-terminal spin Hall oscillator. The two-terminal spin Hall oscillator includes: a spin current source; a MTJ device including a free layer coupled to the spin current source, a tunnel barrier layer, and a pinned layer; and an electrode coupled to the MTJ device. The free layer and the pinned layer of the MTJ device each have a magnetization hard axis parallel to a quantization axis of a spin current injected by a spin Hall effect of the spin current source.

Also, the spin Hall oscillator may be configured including multiple spin Hall oscillators having the same structure or a different structure. The multiple spin Hall oscillators may be electrically or magnetically coupled so as to operate in synchronization, thereby forming a single oscillator.

Also, the spin current source may include one or multiple elements selected from a group consisting of Pt, Ta, W, Ir, and 3d, 4d, 5d, 4f, and 5f elements that provide a strong spin orbital interaction.

Also, the spin current source may include one or multiple materials selected from a group consisting of topological insulators such as BiSb, $Bi_2Se_3$, $Bi_2Te_3$, and $(Bi,Sb)_2Te_3$.

Also, the free layer may be configured as a magnetic layer including one or multiple elements selected from a group consisting of Co, Fe, Ni, Mn, B, Si, Zr, Nb, Ta, Ru, Ir, Pt, Ga, Al, Pd, Tb, and Gd.

Also, the pinned layer may be configured as a magnetic layer including one or multiple elements selected from a group consisting of Co, Fe, Ni, Mn, B, Si, Zr, Nb, Ta, Ru, Ir, Pt, Ga, Al, Pd, Tb, and Gd.

Also, the tunnel barrier layer may be configured as an insulator formed of a metal oxide including one or multiple elements selected from a group consisting of Ga, Al, Mg, Hf, and Zr.

Also, the free layer may be configured as a magnetic layer having a magnetization hard axis provided by one or more from among shape magnetic anisotropy, uniaxial crystal magnetic anisotropy, interfacial magnetic anisotropy, and induced magnetic anisotropy provided by film formation in a magnetic field, annealing in a magnetic field, or oblique deposition, such that the magnetization hard axis is parallel to a quantization axis of a spin current injected by a spin Hall effect of the spin current source.

Also, the spin Hall oscillator may be driven using an ordinary driving method in which a driving current is directly applied, or a pulse excitation oscillation method in which, in a first stage, a large pulse current on the order of approximately 1 ns is applied.

Yet another embodiment of the present disclosure relates to a magnetic recording device. The magnetic recording device includes any one of the spin Hall oscillators described above. The microwaves generated by the spin Hall oscillator may be used to assist recording.

BRIEF DESCRIPTION OF THE DRAWINGS

Embodiments will now be described, by way of example only, with reference to the accompanying drawings which are meant to be exemplary, not limiting, and wherein like elements are numbered alike in several Figures, in which:

FIG. 2B is a diagram showing the parameters used in the simulation;

DETAILED DESCRIPTION

Figure 1A:
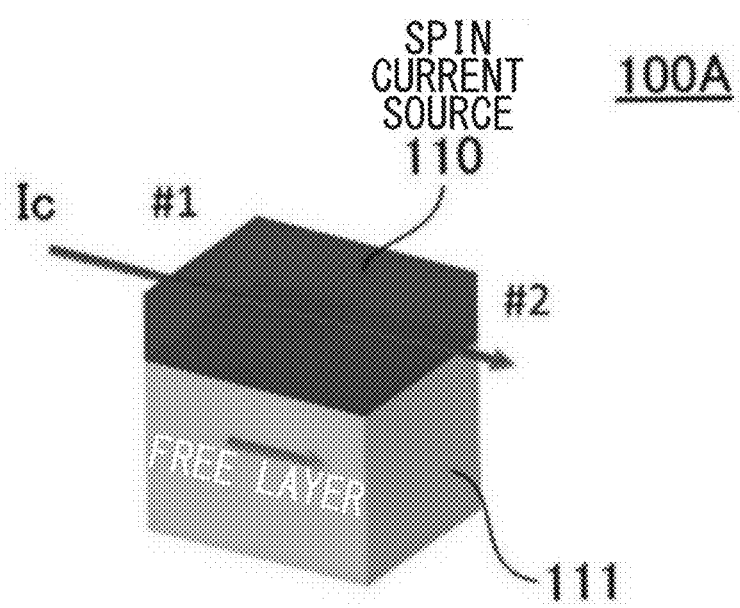
FIG. 1A is a diagram showing a structure of an oscillator according to an embodiment 1.

Description will be made below regarding the present invention based on preferred embodiments with reference to the drawings. The same or similar components, members, and processes are denoted by the same reference numerals, and redundant description thereof will be omitted as appropriate. The embodiments have been described for exemplary purposes only, and are by no means intended to restrict the present invention. Also, it is not necessarily essential for the present invention that all the features or a combination thereof be provided as described in the embodiments.

In some cases, the sizes (thickness, length, width, and the like) of each component shown in the drawings are expanded or reduced as appropriate for ease of understanding. The size relation between multiple components in the drawings does not necessarily match the actual size relation between them. That is to say, even in a case in which a given member A has a thickness that is larger than that of another member B in the drawings, in some cases, in actuality, the member A has a thickness that is smaller than that of the member B.

In the present specification, the state represented by the phrase "the member A is coupled to the member B" includes a state in which the member A is indirectly coupled to the member B via another member that does not substantially affect the electric connection between them, or that does not damage the functions or effects of the connection between them, in addition to a state in which they are physically and directly coupled.

Similarly, the state represented by the phrase "the member C is provided between the member A and the member B" includes a state in which the member A is indirectly coupled to the member C, or the member B is indirectly coupled to the member C via another member that does not substantially affect the electric connection between them, or that does not damage the functions or effects of the connection between them, in addition to a state in which they are directly coupled.

Structure of the Oscillator

Embodiment 1

FIG. 1A is a diagram showing an oscillator 100A according to an embodiment 1. The oscillator 100A includes a spin current source 110 and a free layer 111 coupled to the spin current source 110. The oscillator 100A has a two-terminal structure. As shown in FIG. 1A, the current (which will also be referred to as a "driving current") $I_C$ for generating the spin current flows in the in-plane direction of the spin current source 110 from a terminal #1 to a terminal #2. The free layer 111 is designed such that its magnetization hard axis is parallel to the quantization axis of the spin current injected from the spin current source 110. The spin current generated by the in-plane current $I_C$ is injected into the free layer 111. This provides magnetization precession in the free layer. The high-frequency leakage magnetic field that occurs due to the magnetization precession in the free layer is used as an output.

Embodiment 2

Figure 1B:
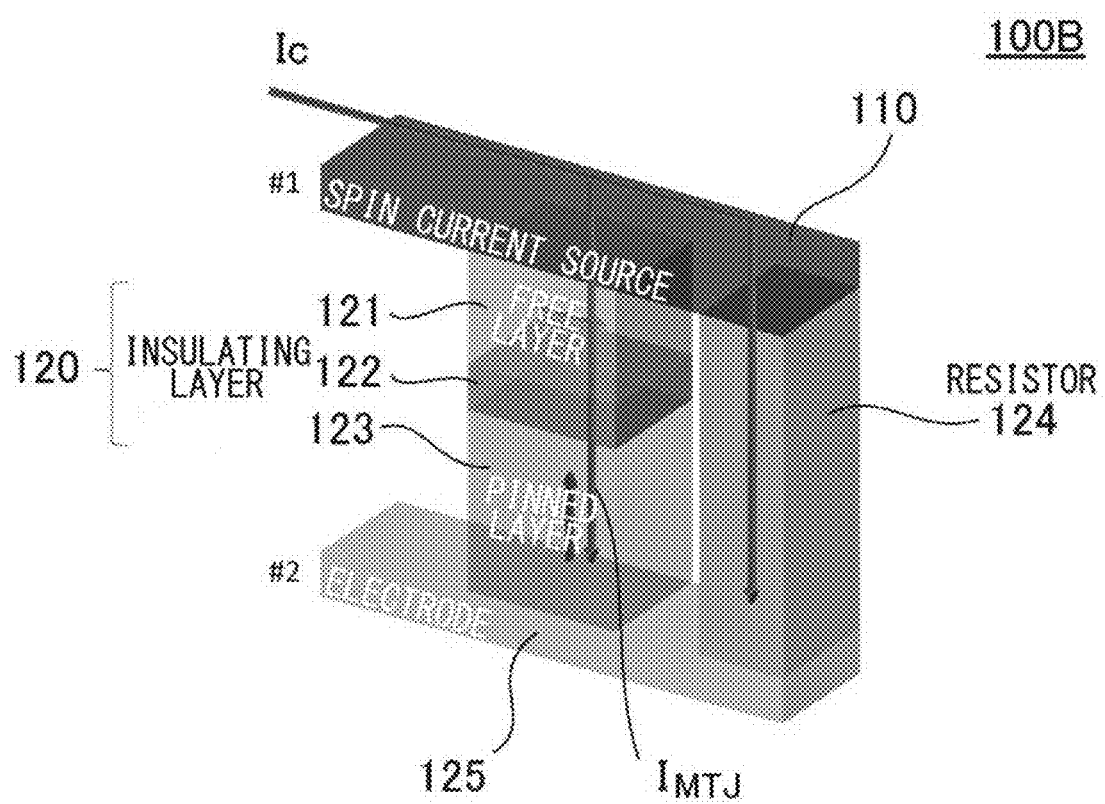
FIG. 1B is a diagram showing a structure of an oscillator according to an embodiment 2.

FIG. 1B is a diagram showing an oscillator 100B according to an embodiment 2. The oscillator 100B includes a spin current source 110, a MTJ element 120, a resistor element 124, and an electrode 125. The oscillator 100B also has a two-terminal structure (#1, #2).

The MTJ element 120 includes a free layer 121, a tunnel barrier layer 122 configured as an insulating layer, and a pinned layer 123. The free layer 121 and the pinned layer 123 are each designed such that their magnetization hard axis is parallel to the quantization axis of the spin current injected from the spin current source 110. As shown in FIG. 1B, the driving current $I_C$ is injected from one terminal #1 of the spin current source 110. The driving current $I_C$ is branched such that the branched currents flow through the MTJ structure and the resistor element 124 arranged parallel to the MTJ element 120. The MTJ current $I_{MTJ}$ and the driving current $I_C$ join together at the electrode 125, following which the joined current flows from the coupled terminal #2. The spin current is generated by a current that passes through the spin current source 110 in the in-plane direction and that flows through the resistor element 124. Magnetization precession occurs in the free layer 121 due to the spin orbit torque effect provided by the spin current injected from the spin current source 110. Here, the spin transfer effect due to the spin current injected from the pinned layer 123 is sufficiently small, and can be ignored. The precession that occurs in the free layer 121 is extracted as an electrical signal due to the TMR effect between the free layer 121 and the pinned layer 123. After the electrical signal thus extracted is converted into microwaves, the microwaves thus converted are emitted. Here, the electrical signal thus extracted from the magnetization precession may be amplified by an amplifier.

Embodiment 3

Figure 1C:
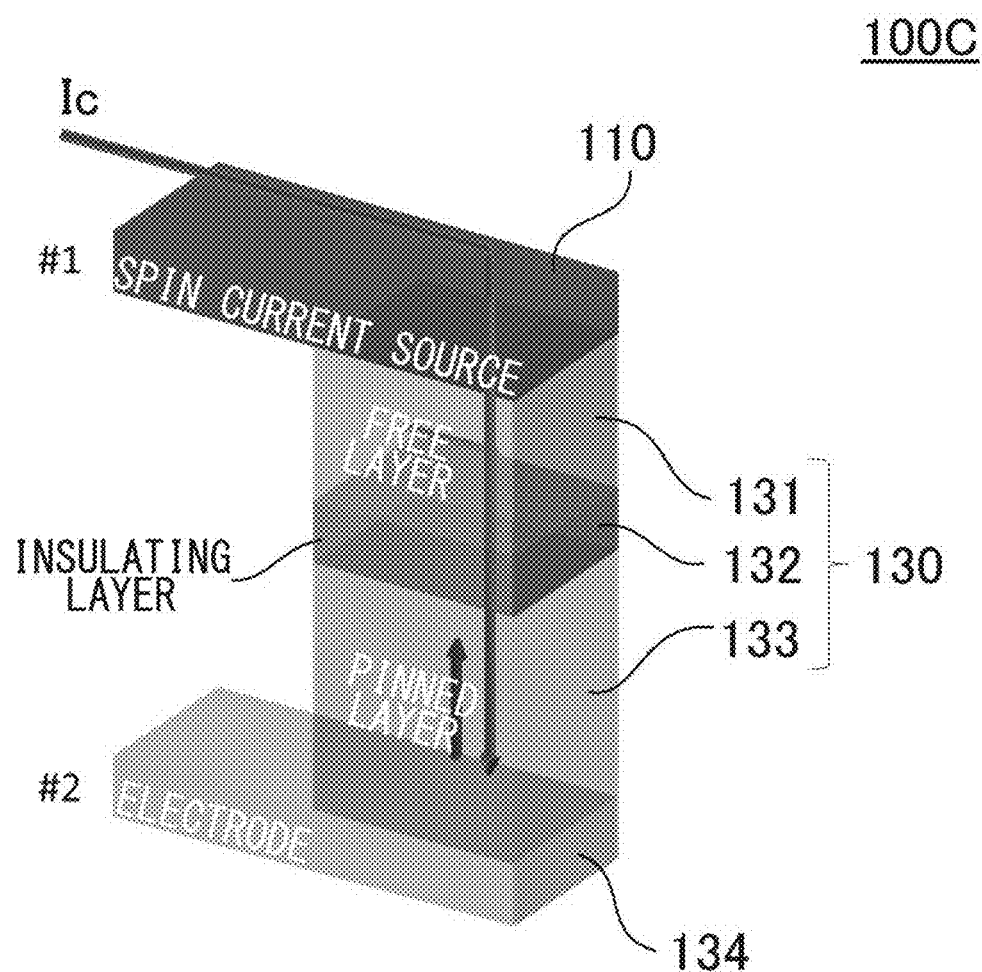
FIG. 1C is a diagram showing a structure of an oscillator according to an embodiment 3.

FIG. 1C is a diagram showing an oscillator 100C according to an embodiment 3. The oscillator 100C includes a spin current source 110, a MTJ element (which will also be referred to as a "MTJ structure") 130, and an electrode 134. The MTJ element 130 is configured including a free layer 131, a tunnel barrier layer 132 configured as an insulating layer, and a pinned layer 133. The oscillator 100C also has a two-terminal structure (#1, #2). As shown in FIG. 1C, the driving current $I_C$ is injected from one terminal #1 of the spin current source 110. Subsequently, the driving current $I_C$ passes through the MTJ structure 130, and flows out from the terminal #2 coupled to the electrode 134. With this configuration, the driving current $I_C$ and the MTJ current $I_{MTJ}$ flow through the same path. The spin current is generated by the in-plane current component that occurs when the current flows into the MTJ structure from the spin current source 110. In particular, the structure shown in FIG. 1C is effective in a case in which the spin current source 110 has a very thin thickness of 1 to 2 nm, or in a case in which the spin current source 110 is formed of a material such as a topological insulator that provides a large spin Hall angle. The free layer 131 and the pinned layer 133 are each designed such that its magnetization hard axis is parallel to the quantization axis of the spin current generated due to the in-plane current component provided by the spin current source 110. The spin current injected from the spin current source 110 provides spin orbit torque effects, which provides magnetization precession in the free layer 131. Here, the spin transfer effect that occurs due to the spin current injected from the pinned layer 133 is sufficiently small, and can be ignored. The magnetization precession in the free layer 131 is extracted as an electrical signal due to the TMR effect. After the electrical signal thus extracted is converted into microwaves, the microwaves thus converted are emitted. Here, the electrical signal thus extracted from the magnetization precession may be amplified by an amplifier.

The spin current sources 110 having the structures shown in FIGS. 1A, 1B, and 1C are each formed of one or multiple metal materials selected from a group consisting of Pt, Ta, W, Ir, and 3d, 4d, 5d, 4f, and 5f elements, or a topological insulator including one or multiple topological insulator materials such as BiSb, $Bi_2Se_3$, $(Bi, Sb)_2Te_3$, etc.

The free layers 111, 121, and 131 shown in FIGS. 1A, 1B, and 1C, and the pinned layers 123 and 133 shown in FIGS. 1B and 1C are each formed of a magnetic material including one or multiple elements selected from a group consisting of Co, Fe, Ni, Mn, B, Si, Zr, Nb, Ta, Ru, Ir, Pt, Ga, Al, Pd, Tb, and Gd.

The tunnel barrier layers 122 and 132 of the MTJ shown in FIGS. 1B and 1C are each formed of an insulator including metal oxide materials formed of one or multiple elements selected from a group consisting of Ga, Al, Mg, Hf, and Zr.

Also, two or more of the same or different structures from among the structures shown in FIGS. 1A, 1B, and 1C may be electrically or magnetically coupled so as to synchronize the structures thus coupled. Such an arrangement also provides a single two-terminal spin Hall oscillator.

Simulation

Figure 2A:
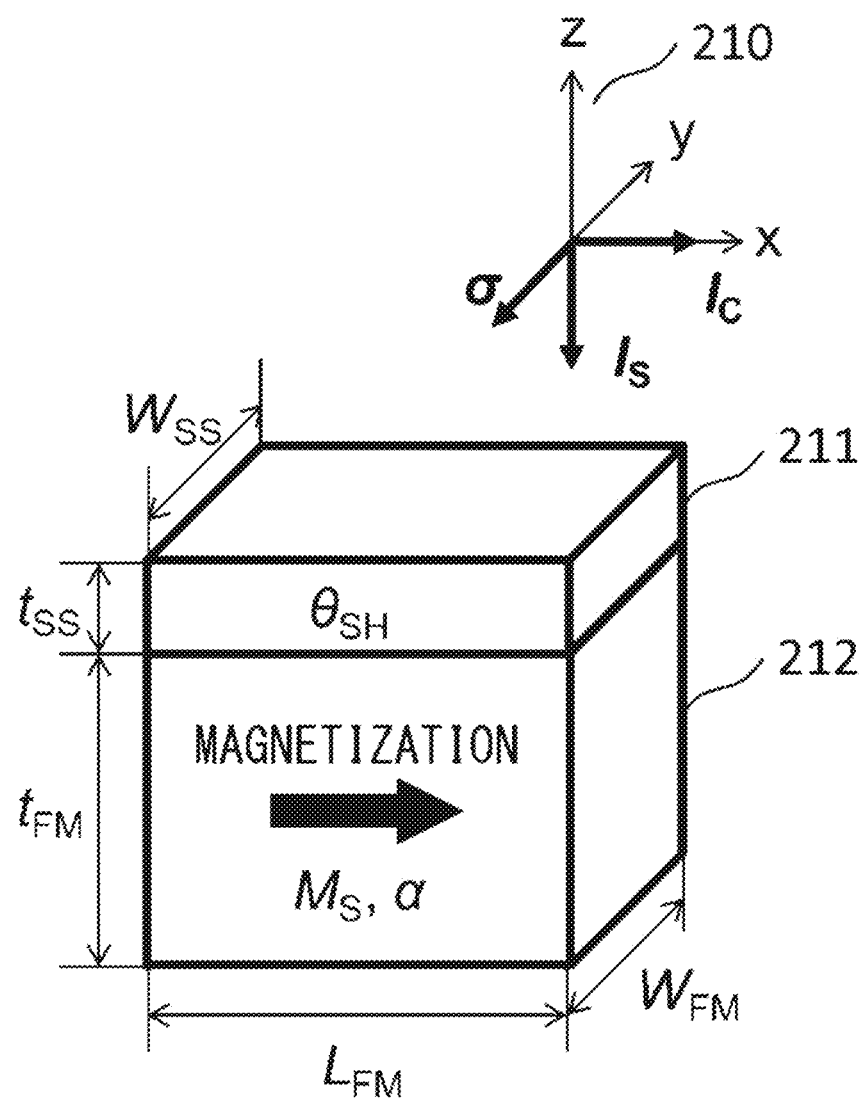
FIG. 2A is a diagram for explaining a coordinate system and the parameters used in simulation.

Numerical simulation was performed using the LLG equation assuming that the oscillator has the structure shown in FIG. 1A. FIG. 2A shows parameters and a coordinate system 210 used in the simulation. Description will be made with the width of the spin current source 211 (110 in FIG. 1A) as $W_{SS}$, with the thickness thereof as $t_{SS}$, with the spin Hall angle thereof as $\theta_{SH}$, with the length of the free layer 212 (111 in FIG. 1A) as $L_{FM}$, with the width thereof as $W_{FM}$, with the thickness thereof as $t_{FM}$, with the magnetic saturation as $M_S$, and with the damping constant as $\alpha$. Also, description will be made assuming that the charge current $I_C$ is applied in the x direction, the spin current $I_S$ is injected in the −z direction, and the spin current has a quantization axis in the −y direction. FIG. 2B shows the setting values of the parameters. The spin current source 211 is assumed to be formed of a W material, which is a parameter of the spin current source 211. The free layer 212 is assumed to be formed of a CoFeB material, which is a parameter of the free layer 212. Furthermore, in the example 1, $N_x'$, $N_y'$, and $N_z'$ are controlled using shape anisotropy alone. That is to say, the relations $N_x'=N_x$, $N_y'=N_y$, and $N_z'=N_z$ hold true.

Figure 2C:
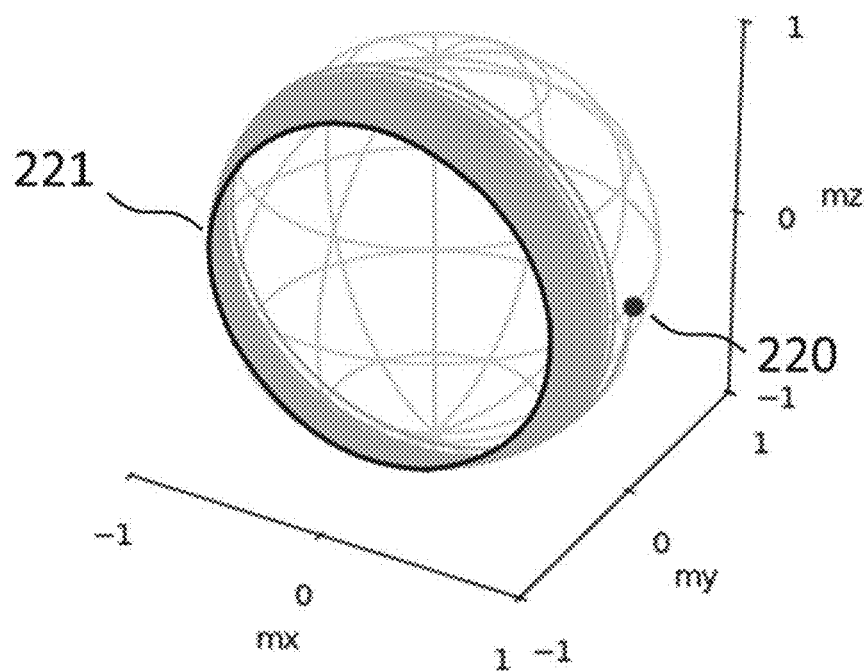
FIG. 2C is a diagram showing an example of the time evolution of the magnetization in a free layer in a unit magnetization vector space.

FIG. 2C shows an example of time evolution of the magnetization orbit in the structure with $L_{FM}$ of 20 nm, $W_{FM}$ of 15 nm, and $t_{FM}$ of 20 nm. Here, $m_x$, $m_y$, and $m_z$ represent the x component, y component, and z component of a unit magnetization vector, respectively. Also, the circle 220 indicates the initial position of the magnetization. The dark solid line 221 indicates the precession orbit in a steady state. In this example, the oscillation condition $N_y'>N_x'$, $N_z'$ is satisfied due to the shape anisotropy. Furthermore, the relation $N_x'=N_z'$ holds true. As can be understood from FIG. 2C, the y axis, which is parallel to the spin quantization axis, is designed to be a magnetization hard axis, which allows the magnetization precession orbit plane to be designed to be parallel to the x-z plane. As can be understood from the simulation result, this allows oscillation to be provided using only the effect of the spin orbit torque due to the spin current injected by the spin current source 211 without using the spin transfer torque from the pinned layer.

In contrast, under the condition $L_{FM} \neq t_{FM}$, oscillation does not occur before the applied current exceeds a particular threshold value. Also, in some cases, relaxation occurs in the −y direction immediately after the oscillation. In this case, a current that is larger than the threshold value may be applied in the form of a pulse current on the order of 1 ns so as to excite oscillation, following which the oscillator may be driven using a low amount of current. Such a method will be referred to as a "pulse excitation oscillation method" hereafter.

Figure 3A:
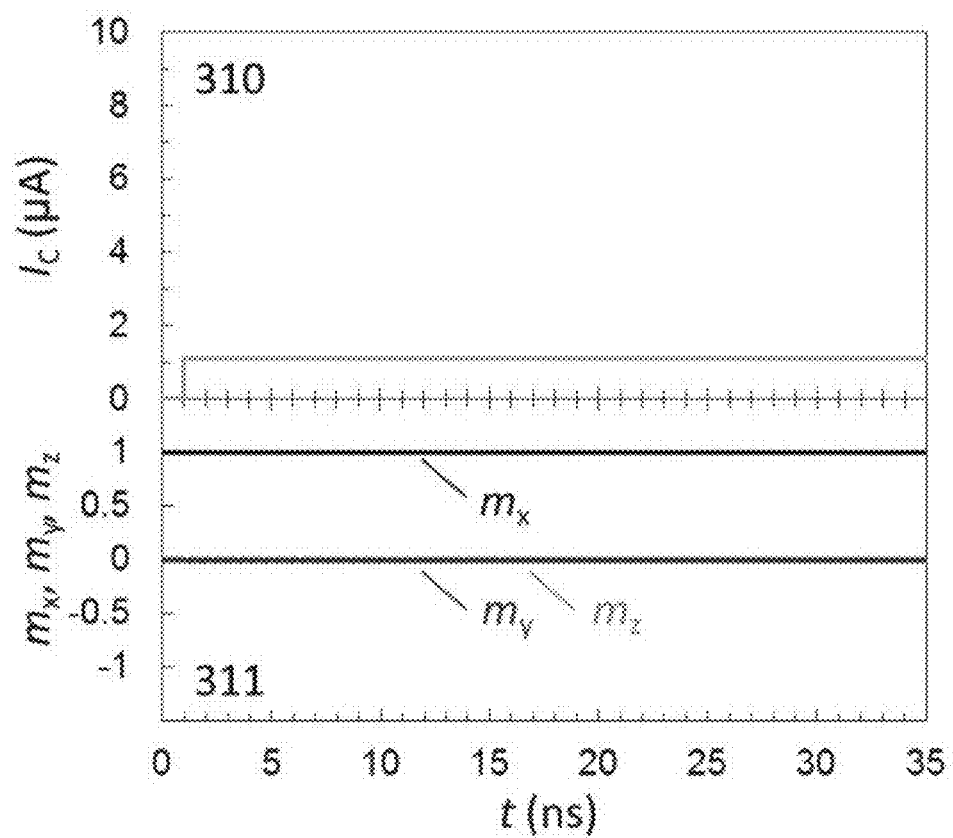
FIG. 3A is a diagram showing the time evolution of each component of the magnetization in the free layer in a case in which the oscillator is driven using an ordinary driving method.

FIG. 3A shows the time evolution 310 of a current and the time evolution 311 of $m_x$, $m_y$, and $m_z$ with a structure with $L_{FM}$ of 21 nm, $W_{FM}$ of 15 nm, and $t_{FM}$ of 20 nm in a case of using an ordinary driving method. As shown in FIG. 3A, it can be understood that such an ordinary driving method is not able to provide effective precession.

Figure 3B:
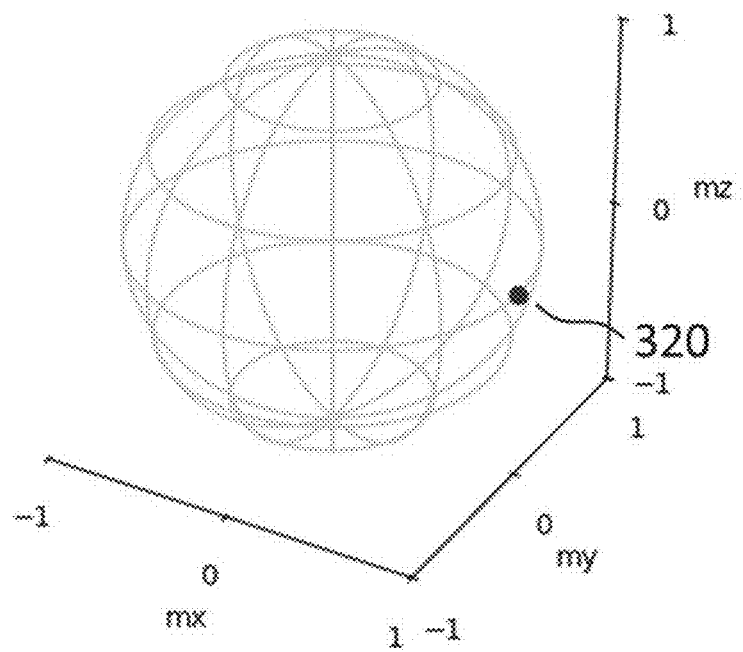
FIG. 3B is a diagram showing the time evolution of the magnetization in the free layer in a unit magnetization vector space in a case in which the oscillator is driven using an ordinary driving method.

FIG. 3B shows the time evolution 311 plotted in a unit magnetization vector space. The circle 320 indicates the initial state of the magnetization. As shown in FIG. 3B, it can be understood that such an ordinary driving method is not able to move the magnetization from the initial state.

Figure 3C:
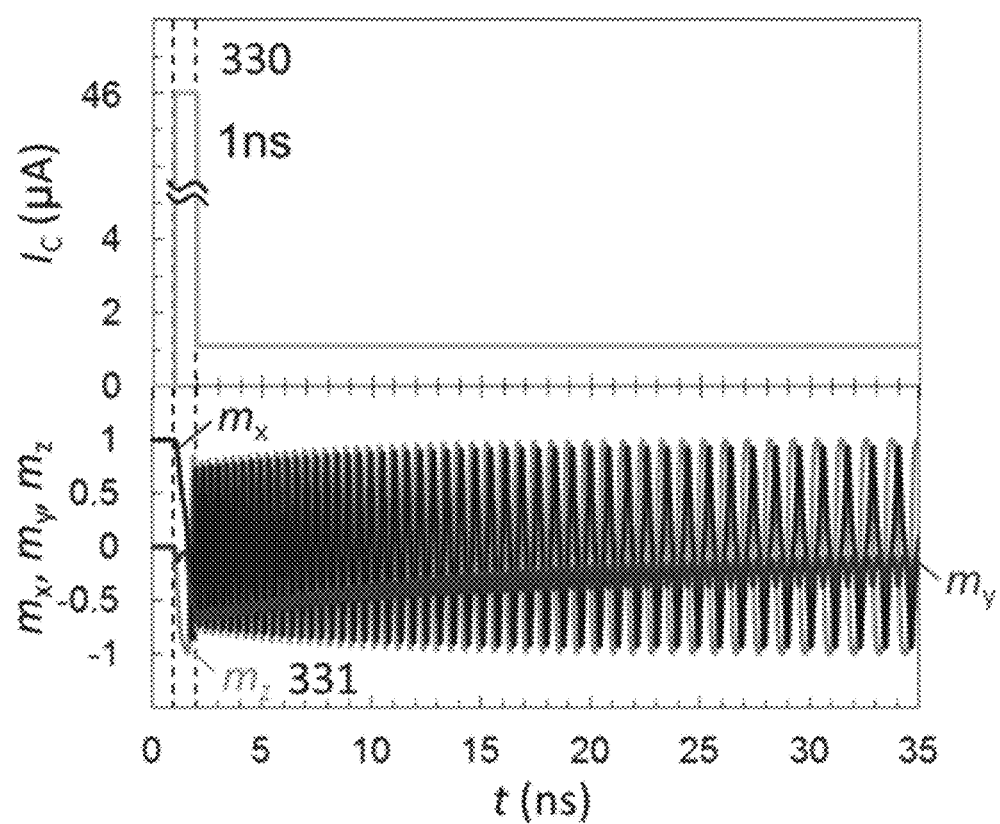
FIG. 3C is a diagram showing the time evolution of each component of the magnetization in the free layer in a case in which the oscillator is driven using a pulse excitation oscillation method.

FIG. 3C shows the time evolution 330 of the current and the time evolution 331 of $m_x$, $m_y$, and $m_z$ in a case of employing the pulse excitation oscillation method. FIG. 3C shows an example in which the current value is finally set to the same value as that shown in FIG. 3A. As shown in FIG. 3C, it can be understood that, with an arrangement using the pulse excitation oscillation method, this provides effective oscillation even if the current value is set to a level in which oscillation cannot be provided using the ordinary driving method.

Figure 3D:
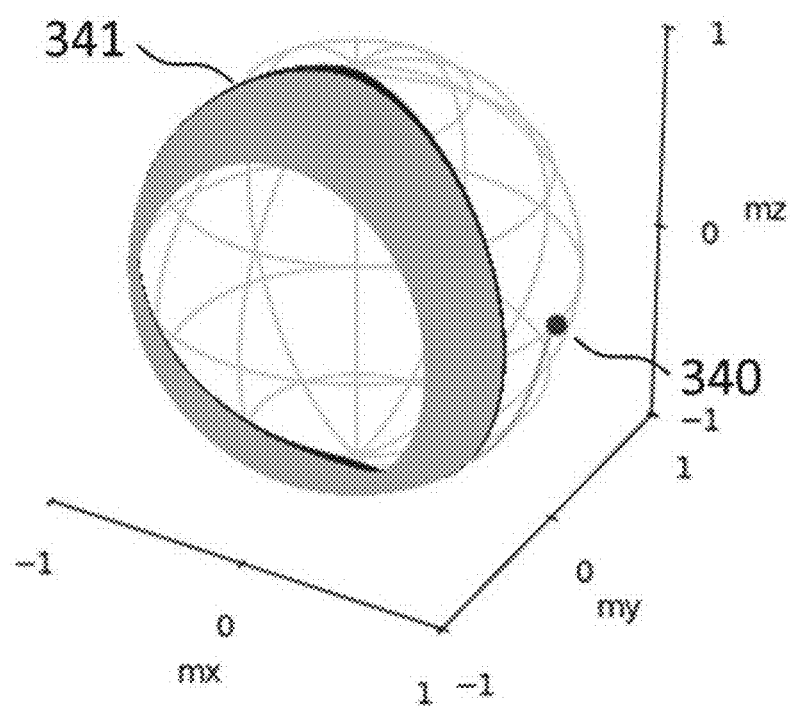
FIG. 3D is a diagram showing the time evolution of the magnetization in the free layer in a unit magnetization vector space in a case in which the oscillator is driven using a pulse excitation oscillation method.

FIG. 3D shows the time evolution 331 plotted in a unit magnetization vector space. The circle 340 indicates the initial position of the magnetization. The dark solid line 341 indicates the precession orbit in a steady state. With the pulse excitation oscillation method, the pulse current, which is applied in the first stage, provides magnetization relaxation in the −y direction. Subsequently, a low current is applied so as to start the magnetization precession with a precession orbit in a steady state. Accordingly, as shown in FIG. 3D, the magnetization orbit can overshoot the steady-state orbit 341 in the −y direction.

The charge current to be applied to the spin current source and the oscillation frequency can be estimated using the following Expression (2). Description will be made with the pulse current value required to excite oscillation using the pulse excitation oscillation method as $I_{sad}$, with the current value required to completely relax the magnetization in the spin quantization axis direction after the oscillation is excited as $I_{max}$, with the minimum current value required to continue the oscillation after the oscillation is excited as $I_{min}$, with the maximum oscillation frequency of the oscillator as $f_{max}$, with the current value required to provide the magnetization oscillation with an orbit of arbitrary energy E as I(E), and with the oscillation frequency of the magnetization oscillation with the orbit of arbitrary energy E as f(E). It should be noted that Expression (2) holds true under the condition $N_y' > N_z' \geq N_x'$. In a case in which $N_y' > N_x' > N_z'$, $N_x'$ may preferably be substituted in the expression for $N_z'$, and $N_z'$ may preferably be substituted for $N_x'$.

$$I_{sad} = \frac{8e\pi M_S^2 t_{FM} t_{SS} W_{SS} \{(N_z' - N_x') + 2\alpha(N_y' - N_x')k\sqrt{1-k^2}\}}{\hbar \theta_{SH} \left(\pi k + 2\alpha\sqrt{1-k^2}\right)} \quad (2)$$

-continued $$I_{max} = \frac{4e\pi \alpha M_S^2 t_{FM} t_{SS} W_{SS} (N_y' - N_x')(1+k^2)}{\hbar \theta_{SH}}$$

$$I_{min} = \frac{16e\alpha M_S^2 t_{FM} t_{SS} W_{SS} (N_y' - N_x')\sqrt{1-k^2}}{\hbar \theta_{SH}}$$

$$f_{max} = 2M_S \gamma k (N_y' - N_x')$$

$$I(E) =$$

$$\frac{16e\alpha M_S^2 t_{FM} t_{SS} W_{SS} (N_y' - N_x')\sqrt{1-p^2}}{\hbar \theta_{SH} p^2} [p^2 K(\beta) + k^2 \{E(\beta) - K(\beta)\}]$$

$$f(E) = \frac{\pi M_S \gamma k (N_y' - N_x')\sqrt{1-p^2}}{K(\beta)}$$

$$k = \sqrt{\frac{N_y' - N_z'}{N_y' - N_x'}}, \quad p = \sqrt{\frac{2\pi M_S^2 N_y' - E}{2\pi M_S^2 N_y' - 2\pi M_S^2 N_x'}},$$

$$\beta = \frac{p}{k}\sqrt{\frac{1-k^2}{1-p^2}} \quad K(\beta) = \int_0^{\frac{\pi}{2}} \frac{du}{1-\beta^2 \sin^2 u},$$

$$E(\beta) = \int_0^{\frac{\pi}{2}} \sqrt{1-\beta^2 \sin^2 u}\, du$$

Figure 4A:
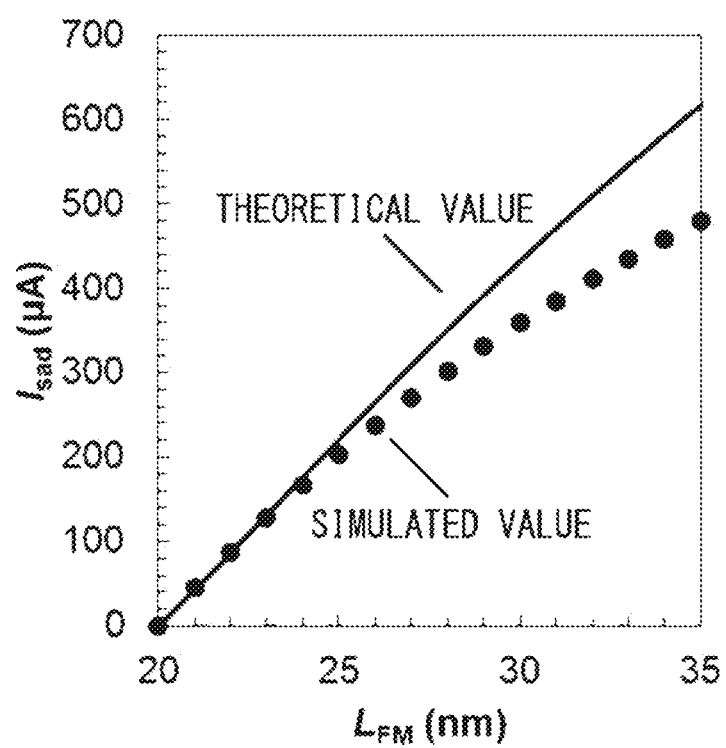
FIG. 4A is a diagram showing the dependence of the threshold current on the length of the free layer.
Figure 4B:
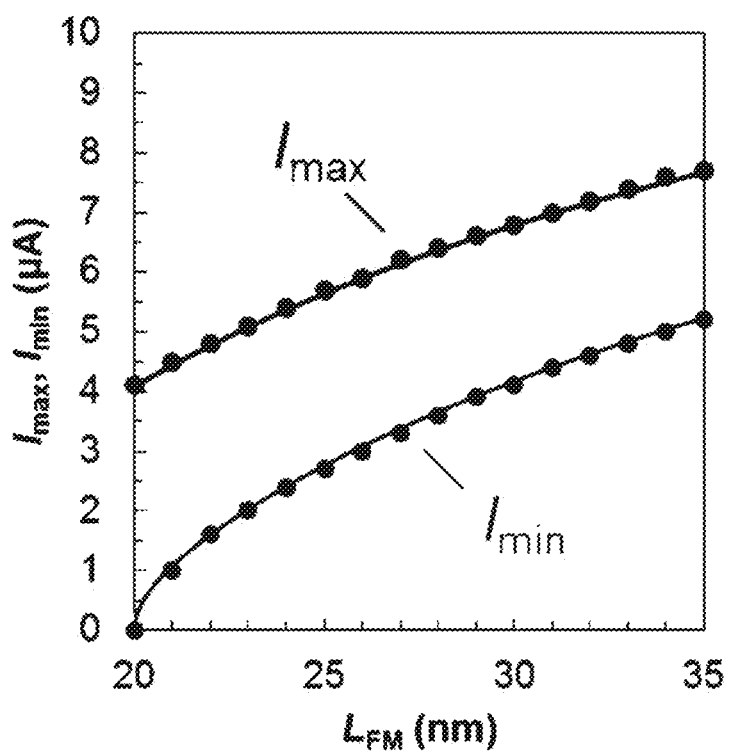
FIG. 4B is a diagram showing the dependence of the maximum oscillation current and the minimum oscillation current on the length of the free layer.
Figure 4C:
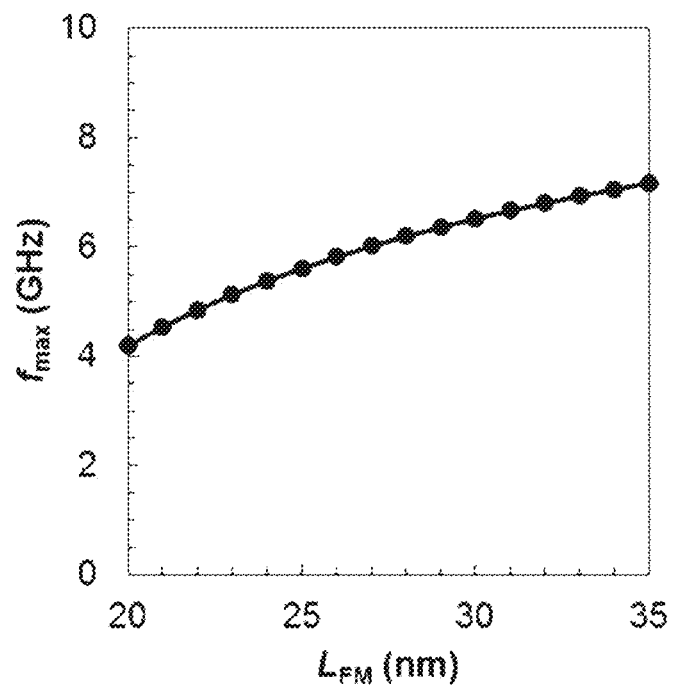
FIG. 4C is a diagram showing the dependence of the maximum oscillation frequency on the length of the free layer.
Figure 4D:
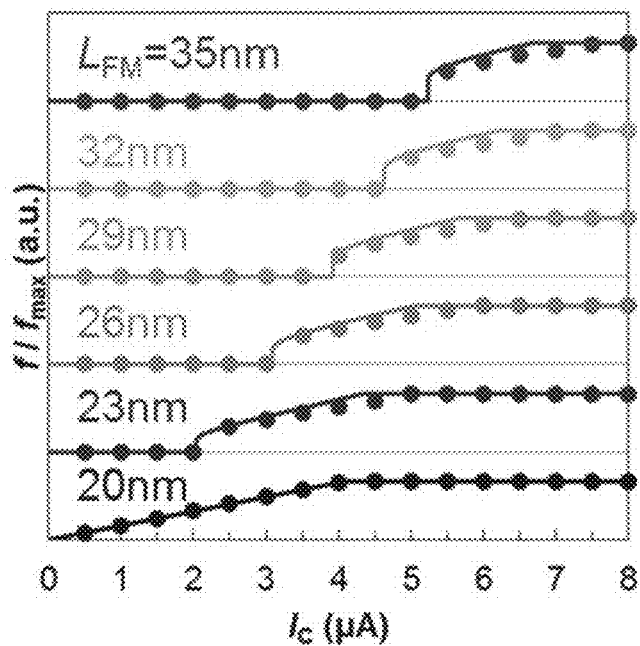
FIG. 4D is a diagram showing the dependence of the normalized oscillation frequency on the current for each free layer length.

Here, "e" represents the elementary charge, "$h_{bar}$" represents the Dirac constant, and "Y" represents the gyromagnetic ratio of the electrons. FIG. 4 shows a comparison between the theoretical values obtained using Expression (2) and the values obtained by the numerical simulation. Specifically, in FIG. 4, the solid line indicates the theoretical values obtained using Expression (2). In contrast, the line of circles represents the values obtained by the numerical simulation. As shown in FIGS. 4A, 4B, and 4C, with such an arrangement using Expression (2), $I_{sad}$, $I_{max}$, $I_{min}$, and $f_{max}$ can be estimated for any $L_{FM}$. Also, as shown in FIG. 4D, this allows the oscillation frequency with respect to any applied current to be estimated.

Figure 5A:
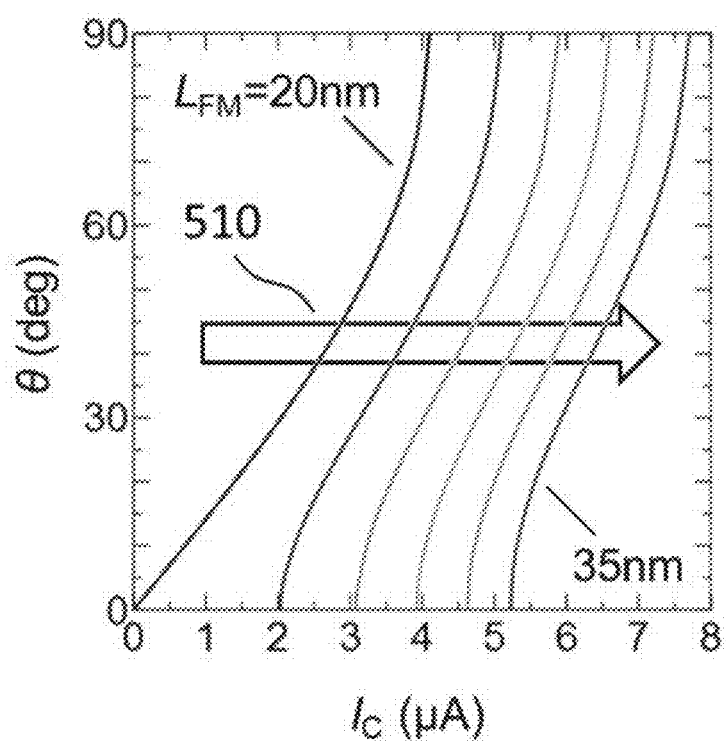
FIG. 5A is a diagram showing the dependence of the minimum magnetization angle measured from the magnetization precession orbital plane on the current for each free layer length.
Figure 5B:
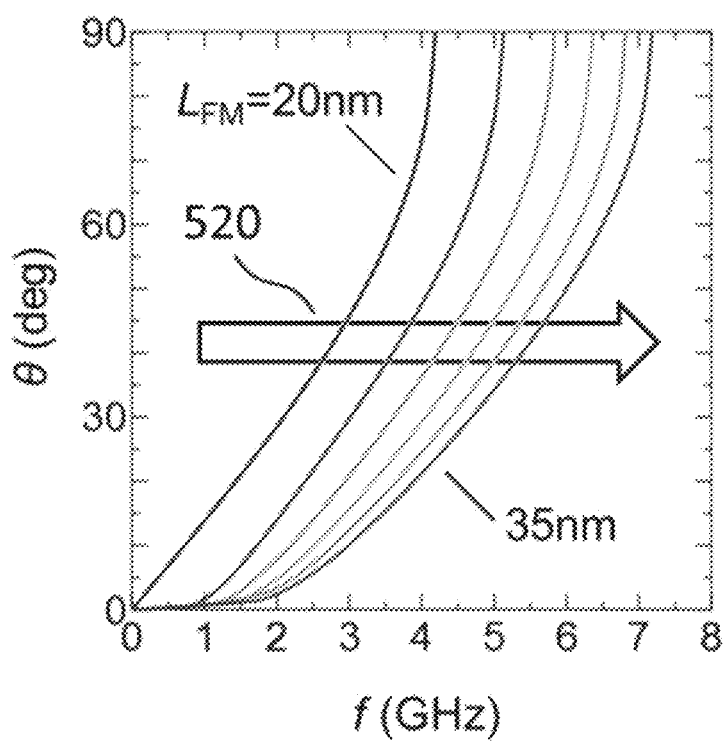
FIG. 5B is a diagram showing the dependence of the minimum magnetization angle measured from the magnetization precession orbital plane on the oscillation frequency for each free layer length.

FIG. 5A shows the relation between $I_C$ and the minimum magnetization angle θ measured with respect to the x-z plane for each $L_{FM}$. FIG. 5B shows the relation between θ and f for each $L_{FM}$. The relations shown in FIGS. 5A and 5B were obtained by simulation. The arrows 510 and 520 in FIGS. 5A and 5B indicate that the $L_{FM}$ increases in increments of 3 nm in the arrow direction. As θ becomes larger, the TMR effect becomes smaller, and accordingly, the oscillation efficiency becomes smaller. Accordingly, there is a difference in the maximum available oscillation frequency depending on the desired oscillation efficiency.

Figure 6:
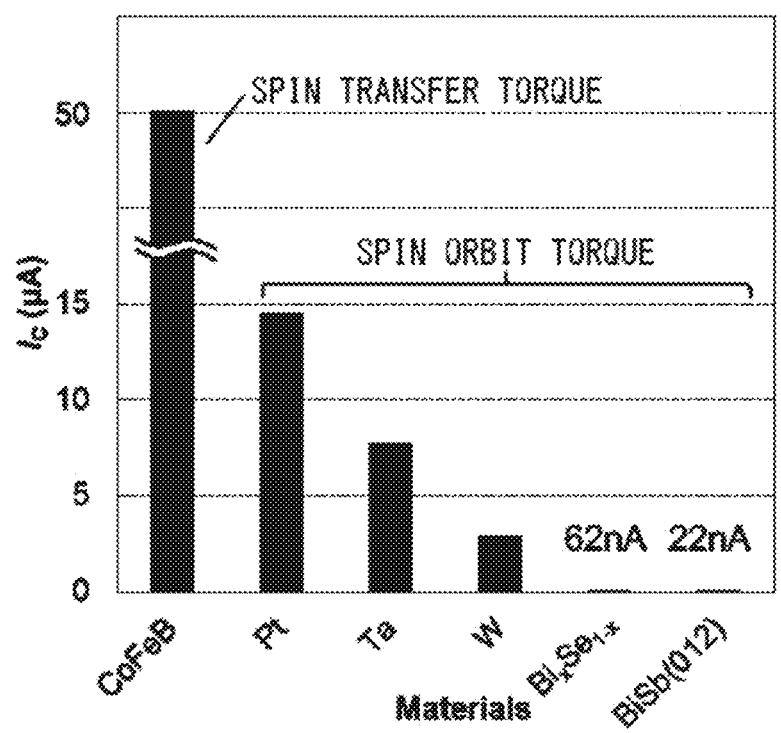
FIG. 6 is a diagram showing the amount of current required for oscillation at 3 GHz for each spin current source material.

As an example of the driving current, FIG. 6 shows a comparison of the amount of current required for oscillation at 3 GHz for each spin current source material. Description will be made assuming that the free layer has a structure with $L_{FM}$ of 20 nm, $W_{FM}$ of 15 nm, and $t_{FM}$ of 20 nm. Also, as a comparison example of a conventional STO, FIG. 6 shows the current value required to provide oscillation at 3 GHz using the spin transfer torque generated by injecting a perpendicular spin polarized current to a free layer. It should be noted that the conventional STO is assumed to have a structure including a free layer with $L_{FM}$ of 50 nm, $W_{FM}$ of 50 nm, $t_{FM}$ of 2 nm, and a pinned layer formed of a CoFeB material. As can be understood from FIG. 6, with such a structure according to the present invention, such an arrangement allows the driving current to be reduced by an order of magnitude as compared with an arrangement using the spin polarized current. Also, with such an arrangement in which the spin current source is configured using a topological insulator, this arrangement allows the driving current to be reduced on the order of several nano ampere.

Figure 7:
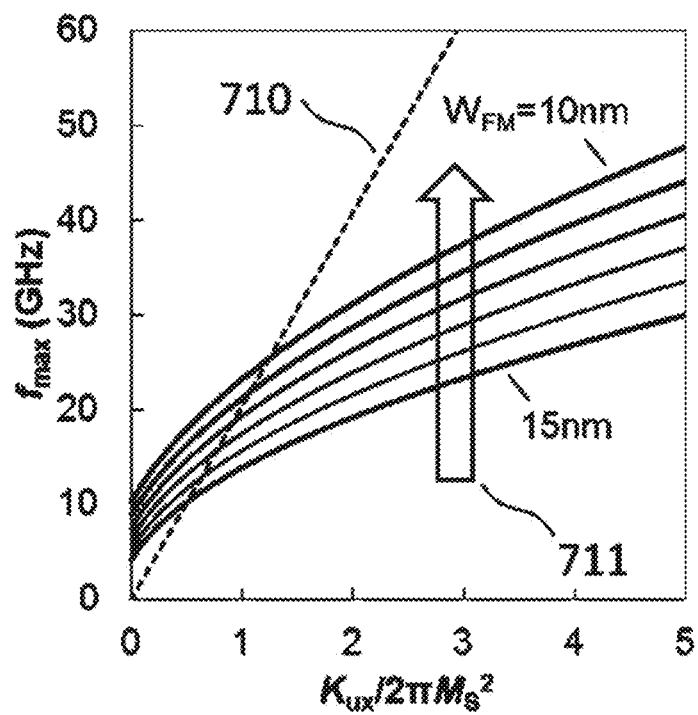
FIG. 7 is a diagram showing the dependence of the maximum oscillation frequency on the uniaxial crystal magnetic anisotropy in the x direction.

FIG. 7 shows the maximum oscillation frequency in a case of adding uniaxial crystal magnetic anisotropy $K_{Ux}$ in the x-axis direction. In FIG. 7, the arrow 711 indicates the direction in which $W_{FM}$ decreases in increments of 1 nm. As shown in FIG. 7, it can be understood that increasing $K_{Ux}$ enables oscillation at a high frequency. Also, the broken line 710 indicates the boundary where $I_{max}$ becomes equal to $I_{min}$. That is to say, effective oscillation cannot be obtained in a region on the right side of the broken line 710. Also, such crystal magnetic anisotropy may be provided in the z-axis direction in addition to the x-axis direction. This allows the broken line 710 to be shifted toward the right side, thereby extending the frequency region in which effective oscillation can be obtained.

With an embodiment of the present invention, a microwave oscillator can be provided having a simple structure that is capable of oscillating with high efficiency with low electric current and with no magnetic field. Also, with an arrangement in which the spin current source is configured using a topological insulator material, the current to be applied to the spin current source can be reduced on the order of several nano ampere. With this, a resistor to be arranged parallel to the MTJ element may be eliminated. Such an arrangement enables oscillation without degrading the durability of the MTJ although a current for the spin current source passes through the MTJ.

Usage

The spin Hall oscillator according to the embodiment is applicable to a microwave assist technique for a magnetic recording device. Specifically, when the magnetization is to be inverted, the microwaves generated by the spin Hall oscillator are irradiated, thereby allowing magnetic anisotropy to be reduced. Such an arrangement provides advantages of both high recording density and low power consumption.

Figure 8:
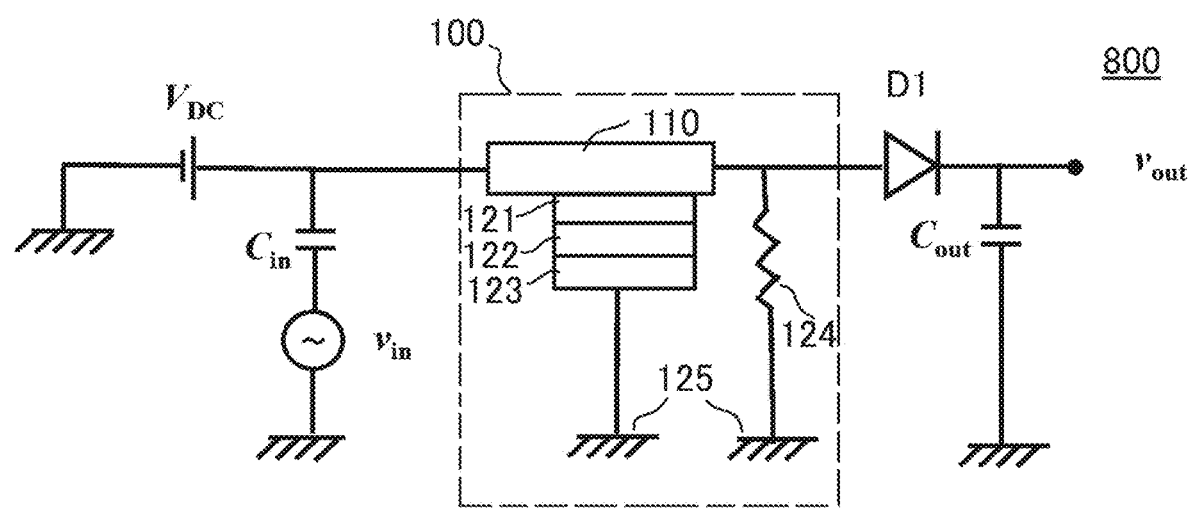
FIG. 8 is a diagram showing an example of an artificial neuron employing the oscillator according to the embodiment.

Also, the spin Hall oscillator according to the embodiment may be employed for an artificial neuron. FIG. 8 is a diagram showing an example of an artificial neuron 800 employing the oscillator 100 according to the embodiment. This example is one from among various kinds of reservoir computing using time division. An input signal $v_{in}$ is input to the oscillator 100 via a coupling capacitor Cin in addition to a DC bias voltage $V_{DC}$. The input signal $v_{in}$ is configured as a voltage signal obtained by multiplying a audio signal or an input signal from a sensor sampled on the time axis by random matrix data (mask data). Furthermore, the time interval at which the input signal $v_{in}$ is input on the time axis is at least one-fifth shorter than the relaxation time of the spin Hall oscillator.

The oscillator 100 shown in FIG. 8 is configured as a type (100B) with a resistor according to the embodiment 2 shown in FIG. 1B. Also, the oscillator 100 may be configured as another type (100C) according to the embodiment 3 shown in FIG. 1C. In this case, a shunt resistor may be omitted. A rectifier diode D1 and a smoothing capacitor COUT are provided on the output side of the oscillator 100. With the present example, the oscillator 100 having a simple structure configured to oscillate with high efficiency, low current, and no magnetic field is employed. Accordingly, with an arrangement in which a great number of such artificial neurons 800 are arranged, this provides a reservoir computer that supports parallel computing.

The invention claimed is:

1. A two-terminal spin Hall oscillator comprising:
a spin current source; and
a free layer coupled to the spin current source,
wherein the free layer has a magnetization hard axis that is parallel to a quantization axis of a spin current injected due to a spin Hall effect of the spin current source.

2. A two-terminal spin Hall oscillator comprising:
a spin current source;
a magnetic tunnel junction (MTJ) device comprising a free layer coupled to the spin current source, a tunnel barrier layer, and a pinned layer; and
an electrode coupled to the MTJ device,
wherein the spin Hall oscillator has a structure in which the spin current source is short-circuited to the electrode via a resistor element coupled in parallel with the MTJ device,
and wherein the free layer and the pinned layer of the MTJ device each have a magnetization hard axis parallel to a quantization axis of a spin current injected by a spin Hall effect of the spin current source.

3. A two-terminal spin Hall oscillator comprising:
a spin current source;
a MTJ device comprising a free layer coupled to the spin current source, a tunnel barrier layer, and a pinned layer; and
an electrode coupled to the MTJ device,
wherein the free layer and the pinned layer of the MTJ device each have a magnetization hard axis parallel to a quantization axis of a spin current injected by a spin Hall effect of the spin current source.

4. A spin Hall oscillator comprising a plurality of spin Hall oscillators having the same structure, wherein the plurality of spin Hall oscillators are electrically or magnetically coupled so as to operate in synchronization, and wherein
at least of the plurality of spin Hall oscillators is the two-terminal spin Hall oscillator according to claim 1.

5. The spin Hall oscillator comprising a plurality of spin Hall oscillators having the same structure or a different structure,
wherein the plurality of spin Hall oscillators are electrically or magnetically coupled so as to operate in synchronization, and wherein
at least of the plurality of spin Hall oscillators is the two-terminal spin Hall oscillator according to claim 2.

6. The spin Hall oscillator comprising a plurality of spin Hall oscillators having the same structure or a different structure,
wherein the plurality of spin Hall oscillators are electrically or magnetically coupled so as to operate in synchronization, and wherein
at least of the plurality of spin Hall oscillators is the two-terminal spin Hall oscillator according to claim 1.

7. The spin Hall oscillator according to claim 1, wherein the spin current source includes one or a plurality of elements selected from a group consisting of Pt, Ta, W, Ir, 3d, 4d, 5d, 4f, and 5f elements that provide a strong spin orbital interaction.

8. The spin Hall oscillator according to claim 2, wherein the spin current source includes one or a plurality of elements selected from a group consisting of Pt, Ta, W, Ir, 3d, 4d, 5d, 4f, and 5f elements that provide a strong spin orbital interaction.

9. The spin Hall oscillator according to claim 3, wherein the spin current source includes one or a plurality of elements selected from a group consisting of Pt, Ta, W, Ir, 3d, 4d, 5d, 4f, and 5f elements that provide a strong spin orbital interaction.

10. The spin Hall oscillator according to claim 1, wherein the spin current source includes one or a plurality of materials from among topological insulators such as BiSb, Bi2Se3, Bi2Te3, and (Bi,Sb)2Te3.

11. The spin Hall oscillator according to claim 2, wherein the spin current source includes one or a plurality of materials from among topological insulators such as BiSb, Bi2Se3, Bi2Te3, and (Bi,Sb)2Te3.

12. The spin Hall oscillator according to claim 3, wherein the spin current source includes one or a plurality of materials from among topological insulators such as BiSb, Bi2Se3, Bi2Te3, and (Bi,Sb)2Te3.

13. The spin Hall oscillator according to claim 1, wherein the free layer is configured as a magnetic layer including one or a plurality of elements selected from a group consisting of Co, Fe, Ni, Mn, B, Si, Zr, Nb, Ta, Ru, Ir, Pt, Ga, Al, Pd, Tb, and Gd.

14. The spin Hall oscillator according to claim 2, wherein the free layer is configured as a magnetic layer including one or a plurality of elements selected from a group consisting of Co, Fe, Ni, Mn, B, Si, Zr, Nb, Ta, Ru, Ir, Pt, Ga, Al, Pd, Tb, and Gd.

15. The spin Hall oscillator according to claim 3, wherein the free layer is configured as a magnetic layer including one or a plurality of elements selected from a group consisting of Co, Fe, Ni, Mn, B, Si, Zr, Nb, Ta, Ru, Ir, Pt, Ga, Al, Pd, Tb, and Gd.

16. The spin Hall oscillator according to claim 2, wherein the pinned layer is configured as a magnetic layer including one or a plurality of elements selected from a group consisting of Co, Fe, Ni, Mn, B, Si, Zr, Nb, Ta, Ru, Ir, Pt, Ga, Al, Pd, Tb, and Gd.

17. The spin Hall oscillator according to claim 3, wherein the pinned layer is configured as a magnetic layer including one or a plurality of elements selected from a group consisting of Co, Fe, Ni, Mn, B, Si, Zr, Nb, Ta, Ru, Ir, Pt, Ga, Al, Pd, Tb, and Gd.

18. The spin Hall oscillator according to claim 2, wherein the tunnel barrier layer is configured as an insulator formed of a metal oxide including one or a plurality of elements selected from a group consisting of Ga, Al, Mg, Hf, and Zr.

19. The spin Hall oscillator according to claim 3, wherein the tunnel barrier layer is configured as an insulator formed of a metal oxide including one or a plurality of elements selected from a group consisting of Ga, Al, Mg, Hf, and Zr.

20. The spin Hall oscillator according to claim 1, wherein the free layer is configured as a magnetic layer having a magnetization hard axis provided by one or more from shape magnetic anisotropy, uniaxial crystal magnetic anisotropy, interfacial magnetic anisotropy, and induced magnetic anisotropy provided by film formation in a magnetic field, annealing in a magnetic field, or oblique deposition, such that the magnetization hard axis is parallel to a quantization axis of a spin current injected by a spin Hall effect of the spin current source.

21. The spin Hall oscillator according to claim 2, wherein the free layer is configured as a magnetic layer having a magnetization hard axis provided by one or more from shape magnetic anisotropy, uniaxial crystal magnetic anisotropy, interfacial magnetic anisotropy, and induced magnetic anisotropy provided by film formation in a magnetic field, annealing in a magnetic field, or oblique deposition, such that the magnetization hard axis is parallel to a quantization axis of a spin current injected by a spin Hall effect of the spin current source.

22. The spin Hall oscillator according to claim 3, wherein the free layer is configured as a magnetic layer having a magnetization hard axis provided by one or more from shape magnetic anisotropy, uniaxial crystal magnetic anisotropy, interfacial magnetic anisotropy, and induced magnetic anisotropy provided by film formation in a magnetic field, annealing in a magnetic field, or oblique deposition, such that the magnetization hard axis is parallel to a quantization axis of a spin current injected by a spin Hall effect of the spin current source.

23. The spin Hall oscillator according to claim 1, configured to be driven using an ordinary driving method in which a driving current is directly applied, or a pulse excitation oscillation method in which, in a first stage, a large pulse current on the order of approximately 1 ns is applied.

24. The spin Hall oscillator according to claim 2, configured to be driven using an ordinary driving method in which a driving current is directly applied, or a pulse excitation oscillation method in which, in a first stage, a large pulse current on the order of approximately 1 ns is applied.

25. The spin Hall oscillator according to claim 3, configured to be driven using an ordinary driving method in which a driving current is directly applied, or a pulse excitation oscillation method in which, in a first stage, a large pulse current on the order of approximately 1 ns is applied.

26. A magnetic recording device comprising the spin Hall oscillator according to claim 1, wherein microwaves generated by the spin Hall oscillator are used to assist recording.

27. A magnetic recording device comprising the spin Hall oscillator according to claim 2, wherein microwaves generated by the spin Hall oscillator are used to assist recording.

28. A magnetic recording device comprising the spin Hall oscillator according to claim 3, wherein microwaves generated by the spin Hall oscillator are used to assist recording.

29. A computer provided with an artificial neuron comprising the spin Hall oscillator according to claim 1.

30. A computer provided with an artificial neuron comprising the spin Hall oscillator according to claim 2.

31. A computer provided with an artificial neuron comprising the spin Hall oscillator according to claim 3.

* * * * *